(12) United States Patent
Leibl

(10) Patent No.: US 7,521,919 B2
(45) Date of Patent: *Apr. 21, 2009

(54) MEASURING DEVICE FOR MEASURING AN ELECTRICAL CURRENT

(75) Inventor: Thomas Leibl, Seelbach (DE)

(73) Assignee: Schneider Electric Motion Deutschland GmbH & Co. KG, Lahr (DE)

(*) Notice: Subject to any disclaimer, the term of this patent is extended or adjusted under 35 U.S.C. 154(b) by 0 days.

This patent is subject to a terminal disclaimer.

(21) Appl. No.: 11/843,456

(22) Filed: Aug. 22, 2007

(65) Prior Publication Data

US 2008/0048645 A1  Feb. 28, 2008

(30) Foreign Application Priority Data

Aug. 23, 2006 (DE) .................... 10 2006 039 411

(51) Int. Cl.
*G01R 19/00* (2006.01)

(52) U.S. Cl. ..................... 324/158.1; 324/120

(58) Field of Classification Search ........... None
See application file for complete search history.

(56) References Cited

U.S. PATENT DOCUMENTS 4,298,838 A * 11/1981 Akamatsu et al. ....... 324/117 R
4,477,761 A * 10/1984 Wolf .......................... 318/800
5,563,776 A * 10/1996 Eck .............................. 363/26
6,177,791 B1 * 1/2001 Lenhard ...................... 323/357

FOREIGN PATENT DOCUMENTS

| AT | 175615   | 1/1953  |
| DE | 4117505  | 12/1992 |
| DE | 19746349 | 5/1999  |
| DE | 10129850 | 1/2002  |

OTHER PUBLICATIONS

"Method and Device for Measuring the Output Current of a Clocked Half-Bridge Circuit" by Thomas Leibl Dec. 17, 1992 (total 12 pages).*

* cited by examiner

*Primary Examiner*—Paresh Patel
(74) *Attorney, Agent, or Firm*—The Webb Law Firm

(57) ABSTRACT

A measuring device for measuring an electrical current has an alternating-current converter (6) that possesses a primary inductance and an ohmic secondary resistance ($R_S$) and whose output is connected across a measured-value signal conditioning device to a measurement output for a current measuring signal. The output of the alternating-current converter (6) has an ohmic secondary resistance ($R_S$). An active compensation circuit, which at least partially compensates for the voltage drop caused by a current flow in the secondary resistance ($R_S$) at the primary inductance by applying a voltage at the output of the alternating-current converter (6), is disposed between the output of the alternating-current converter (6) and the measurement output.

10 Claims, 10 Drawing Sheets

MEASURING DEVICE FOR MEASURING AN ELECTRICAL CURRENT

BACKGROUND OF THE INVENTION

1. Field of the Invention

The invention relates to a measuring device for measuring an electrical current having an alternating-current converter that possesses a primary inductance and an ohmic secondary resistance and whose output is connected to a measurement output for a current measuring signal across a measured-value signal conditioning device.

2. Description of Related Art

A measuring device of this type for measuring the output current of a half-bridge circuit is disclosed in DE 41 17 505 C2. The half-bridge circuit has two half-bridge sections connected in series that are connected to an output circuit at a connection node. A series circuit comprising a first semiconductor switch and a shunt is disposed in a first half-bridge section, and a second semiconductor switch is disposed in a second half-bridge section. The semiconductor switches are driven in alternation in push-pull operation by means of a control device. In this push-pull operation the first semiconductor switch is closed during a first operating state, and the second semiconductor switch is closed during a second operating state. In the first operating states, one measured value for the current flowing through the first semiconductor switch is acquired each time with the aid of the shunt. This measured value provides the measurement result for the output current. In the first operating states, a second measured value for the alternating current in the output circuit is also acquired by means of an alternating-current converter. This measured value is added to the first measured value. Then the result of this addition is inverted and saved. In the second operating state a measured value for the alternating current flowing in the output circuit is acquired and added to the saved value. The resulting total forms the measurement result in the second operating state.

The measuring device has proven to be effective in actual practice, mainly because it makes it possible to measure current in an output circuit that has a high electrical potential compared with the measurement circuit. However, a disadvantage of the measuring device is that the alternating-current converter has an ohmic secondary resistance at which the secondary current in the alternating-current converter causes a voltage drop. This voltage drop is present at the primary inductance of the alternating-current converter and causes current to flow in this inductance. As a result, the secondary current is no longer proportional to the primary current. As the frequency of the primary current decreases, the share of this current in the primary inductance increases. In order to achieve a low cutoff frequency, the primary inductance of the alternating-current converter must be sufficiently large. This results in the alternating-current converter having a larger volume.

SUMMARY OF THE INVENTION

The object of the invention therefore is to provide a measuring device of the type referred to above with which the lower cutoff frequency is as low as possible.

This object is accomplished by disposing, between the output of the alternating-current converter and the measurement output, an active compensation circuit that at least partially compensates for the voltage drop caused by a current flow in the secondary resistance at the primary inductance by applying a voltage at the output of the alternating-current converter.

The advantage that results is that only a very low electrical voltage is present at the primary inductance of the alternating-current converter. The measuring device therefore makes it possible to achieve high measuring accuracy. The alternating-current converter has windings that preferably are electrically isolated from each other. However, it can also be an autotransformer in which the secondary winding comprises part of the primary winding.

The compensation circuit is preferably designed as an INIC whose internal resistance preferably is quantitatively somewhat smaller or somewhat larger than the secondary resistance. Therefore, a rule circuit that applies a voltage—that for the most part compensates for the secondary voltage drop—to the output of the current converter is provided as the compensation circuit. The compensation circuit can be implemented economically with the aid of an operational amplifier and ohmic resistances.

It is advantageous if the measuring device has at least one clocked semiconductor switch that is connected by means of a control connection to a control device and if the input of the alternating-current converter is connected in series to the semiconductor switch. The semiconductor switch can then be modulated to set the current flow pulse width.

In this case, the measured value is formed from the difference between the two measured-value signals.

In a preferred embodiment of the invention the measured-value signal conditioning device has means for generating at least two measured-value signals, of which a first measured-value signal corresponds to the output current of the alternating-current converter when the semiconductor switch is closed and a second measured-value signal corresponds to the output current of the alternating-current converter when the semiconductor switch is open, and wherein the connections carrying the measured-value signals are connected to the measurement output across a subtraction element. The current in the series circuit comprising the semiconductor switch and the alternating-current converter can be measured in this way nearly free of losses, both with respect to its direct-current component and with respect to its alternating-current component. The lower cutoff frequency of the alternating-current converter preferably is significantly smaller than the switching frequency of the semiconductor switch.

In a preferred embodiment of the invention the sample-and-hold element is connected by means of a control connection to the control device for the semiconductor switch in such a way that the sampling for the first measured-value signal occurs centered in a time interval while the semiconductor switch is closed, and/or the sampling for the second measured-value signal occurs centered in a time interval while the semiconductor switch is open. The output current of the clocked circuit can then be measured with high precision.

The output of the alternating-current converter preferably is connected to a first input of a subtraction element, and the output of the subtraction element is connected to the measurement output and to an input of an additional sample-and-hold element, whose output is connected to a second input of the subtraction element, and a sampling input of the additional sample-and-hold element is connected to the control device by means of a control connection in such a way that the measurement output is controlled to a specified electrical potential when the first semiconductor is closed or open. The output signal of the measuring device can then be controlled to zero for example at times during which no primary current is flowing in the alternating-current converter. An analog-digital converter that samples the output signal can then have a correspondingly reduced control range.

The subtraction element preferably has a feed-back operational amplifier.

It is advantageous if a second alternative-current converter is connected in the output current circuit, if the output of the first alternating-current converter and the output of the second alternating-current converter are connected to the inputs of a first addition element and the output of this addition element is attached to a buffer, if the buffer has a control connection to the control device for closing the connection between the output of the first addition element and the buffer when the semiconductor switch is closed, if after the buffer a second addition element, whose one input is connected to the buffer and whose other input is connected to the output of the second alternating-current converter, is connected to the buffer, and if the output of the second addition element forms the output current measuring output. The output current of the clocked circuit can then be measured continuously.

It is advantageous if the measuring device has a second semiconductor switch that is connected in series to the first semiconductor switch and whose connection node is connected to an output connection, and the semiconductor switches are controllable in a push-pull configuration by means of the control device to form a clocked half-bridge circuit It is possible, for example, to control an electric motor, such as a stepper motor or a servo motor, with the aid of the half-bridge circuit. In the electrical drive unit that is comprised of the measuring device and the electric motor, the winding is preferably driven by means of three half-bridges connected together to form a three-phase bridge.

In a preferred embodiment of the invention the second alternating-current converter has a second primary inductance and a second ohmic secondary resistance; and a second active compensation circuit that at least partially compensates for the voltage drop caused at the second primary inductance by a current flow in the second secondary resistance by applying a voltage at the output of the second alternating-current converter is located between the output of the second alternating-current converter and the inputs of the first addition element.

The measuring device then permits even greater measuring accuracy.

BRIEF DESCRIPTION OF THE DRAWINGS

Examples of embodiments of the invention are described in greater detail below based on the drawing. The drawing shows.

DETAILED DESCRIPTION OF THE PREFERRED EMBODIMENTS

Figure 1:
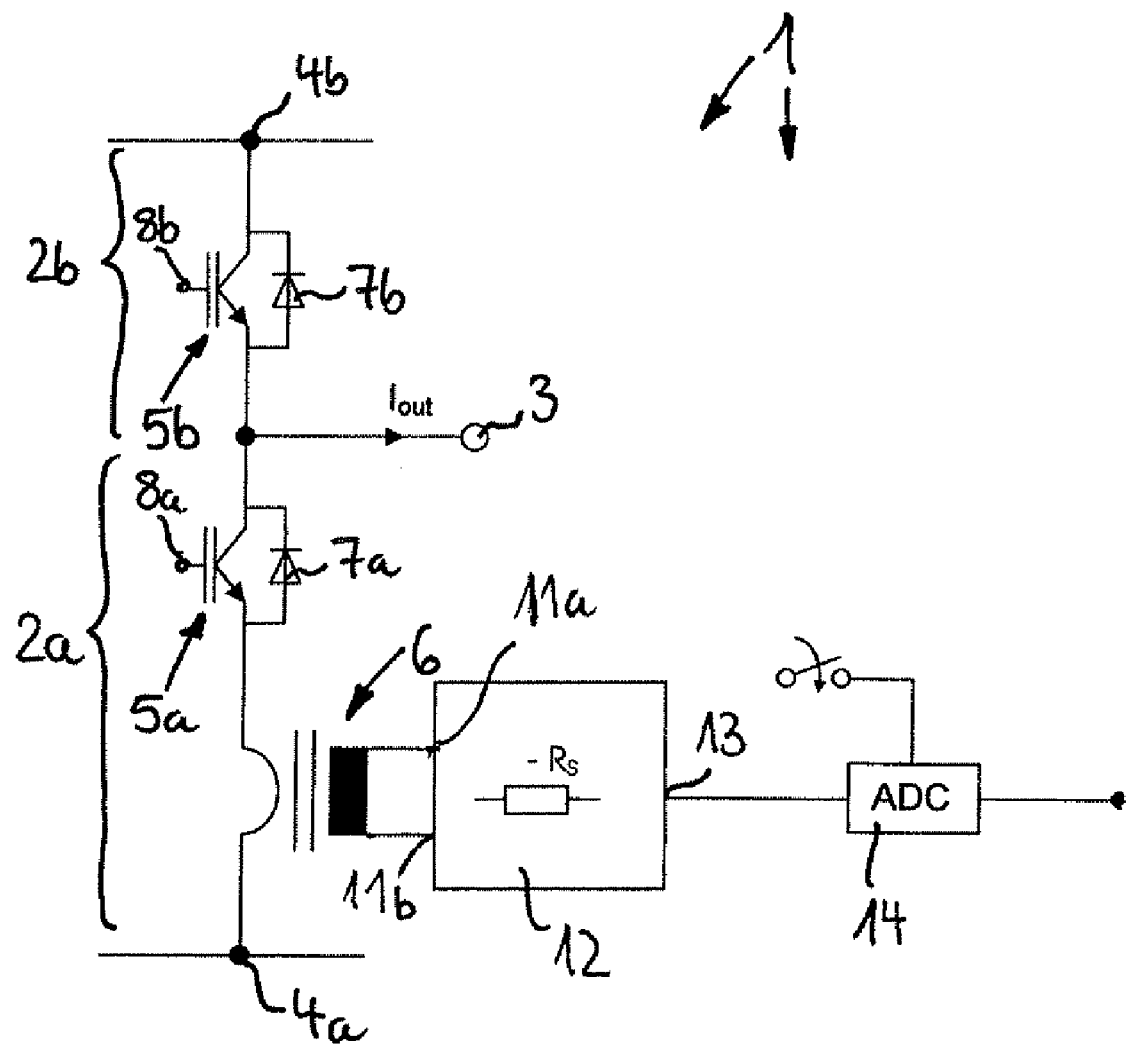
FIG. 1 a circuit diagram of a first example of an embodiment of a half-bridge circuit, FIG. 2 an illustration of the generation of a pulse width modulation signal, where in the upper diagram the count of a counter as well as a comparison value are shown and in the lower diagram the pulse width modulation signal is shown with time plotted on the abscissa and amplitude plotted on the ordinate, FIG. 3 a simplified equivalent circuit diagram of an alternating-current converter, FIG. 4 an illustration of the secondary current (solid line) of an alternating-current converter located in a half-bridge section and of the output current (dotted line) of a half-bridge with time plotted on the abscissa and amperage plotted on the ordinate, FIG. 5 a diagram illustrating the calculation of the measured current value, FIG. 6 a flowchart illustrating the calculation of the measured current value, FIG. 7 a partial circuit diagram of a first example of an embodiment of a measuring device, FIG. 8 a partial circuit diagram of a second example of an embodiment of a measuring device used to measure the output current of a clocked half-bridge circuit, FIG. 9 an illustration of the step responses of an alternating-current converter equipped with an INIC and of an uncompensated alternating-current converter, with time plotted on the abscissa and current plotted on the ordinate, whereby the primary current is indicated by $i_p$, FIG. 10 a partial circuit diagram of a third example of an embodiment of the measuring device, and FIG. 11 a partial circuit diagram of a fourth example of an embodiment of the measuring device.

A measuring device identified in its entirety in FIG. 1 by the number 1 for measuring the output current of a clocked circuit that is used to control an electric motor has a half-bridge with two half-bridge sections 2a, 2b connected in series. The half-bridge sections 2a, 2b are connected at a connection node to an output connection 3 that is connected to a winding connection of the electric motor. A first half-bridge section 2a is connected on its end on the opposite side of output connection 3 to a first pole 4a of a power source, which is not specifically shown in the drawing, and a second half-bridge section 2b is connected on its end on the opposite side of output connection 3 to a second pole 4b of the power source.

As can be seen in FIG. 1, a series circuit comprising a first semiconductor switch 5a and the primary winding of an alternating-current converter 6 is located in the first half-bridge section 2a, and a second semiconductor switch 5b is located in the second half-bridge section 2b. A freewheeling diode 7a, 7b that connects the emitter to the collector of the semiconductor switch 5a, 5b is connected in parallel to the semiconductor switches 5a, 5b, respectively. The control inputs 8a, 8b of the semiconductor switches 5a, 5b are connected to a control device that sends pulse width modulation signals to the control inputs 8a, 8b in such a way that the semiconductor switches 5a, 5b are alternately opened and closed.

Figure 2:
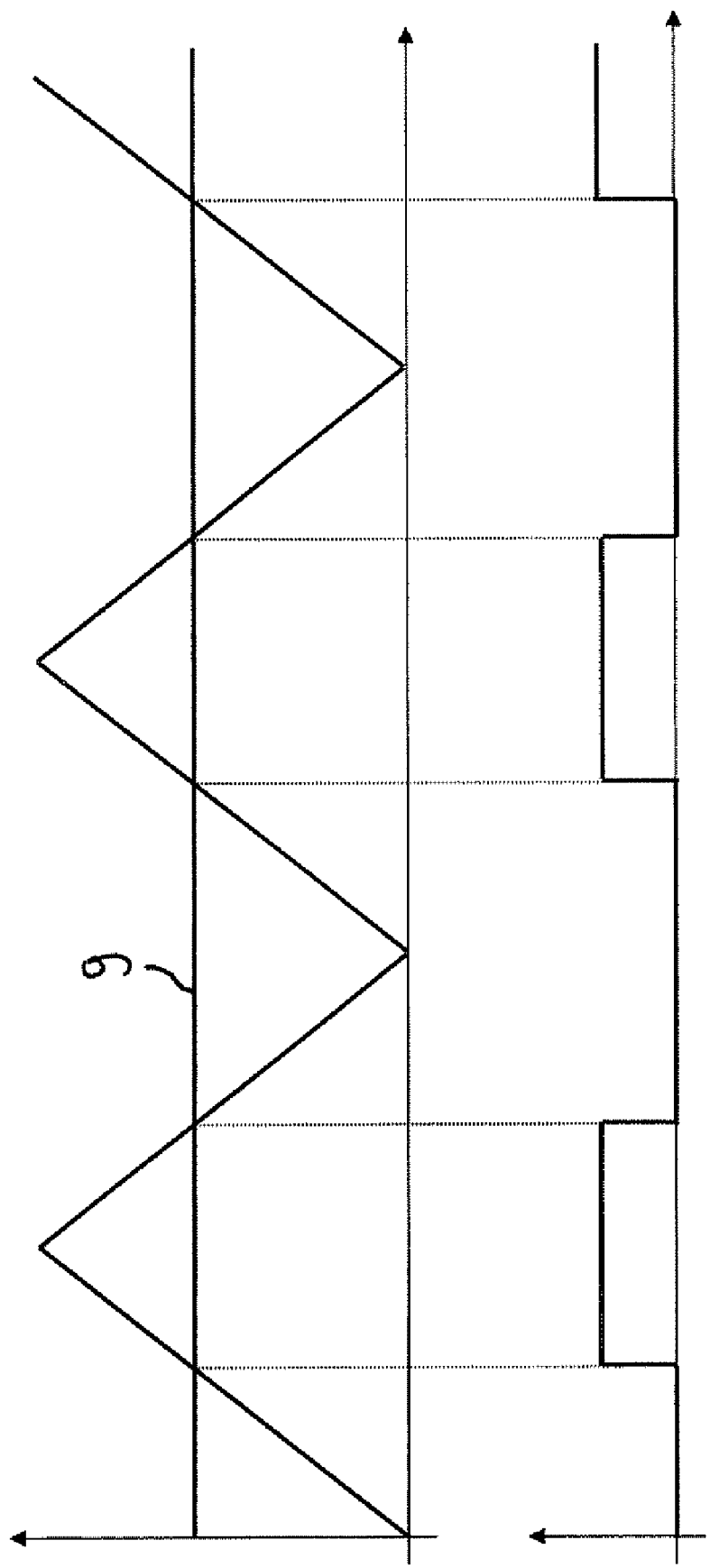

To generate the pulse width modulation signals, the control device has a counter that is periodically incremented until the specified maximum count is reached (FIG. 2). Thereupon, the counter is decremented until a minimum count is reached. Then the cycle is repeated periodically. The count is compared with a specified reference value 9. If the count is greater than the reference value, a first potential is assigned to a control signal (FIG. 2 below); otherwise, a second potential is assigned. The first control input 8a is controlled with the control signal, and the second control input 8b is controlled with a signal that is inverse to the control signal.

Figure 3:
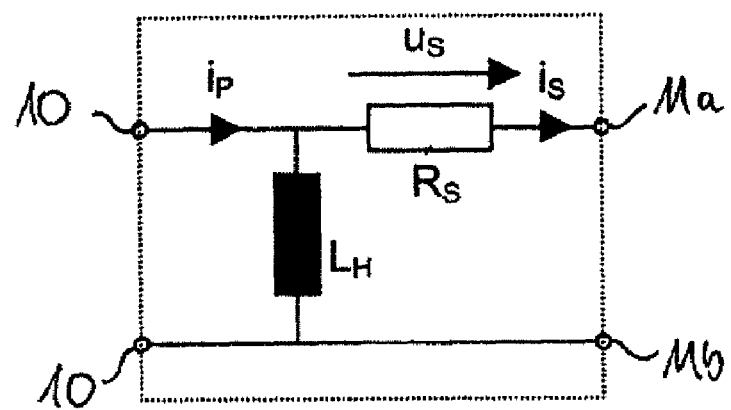

The alternating-current converter 6 generates by transformational means a significantly smaller secondary current from the current flowing through the first semiconductor switch 5a. This smaller secondary current is fed into a measured-value signal conditioning device. FIG. 3 shows that the equivalent circuit diagram of the alternating-current converter 6 has a primary inductance $L_H$ that is arranged parallel to the converter input connections 10. The alternating-current converter 6 also has an ohmic secondary resistance $R_S$ that is connected in series with the primary inductance $L_H$ starting at a first converter output connection 11a and going to a second converter output connection 11b. A secondary current flowing between the converter output connections 11a, 11b causes a voltage drop at the secondary resistance $R_S$.

The measured-value signal conditioning device has an active compensation circuit 12 that applies a voltage directed in opposition to the voltage drop at the secondary resistance $R_s$ between the converter output connections 11. This voltage largely compensates for the voltage drop that is caused at the primary inductance $L_H$ that occurs at the secondary resistance $R_s$.

An analog-digital converter 14, which is only represented schematically in the drawing, is attached at an output 13 of the compensation circuit 12. It samples and digitizes the voltage that is present at compensation circuit output 13.

Figure 4:
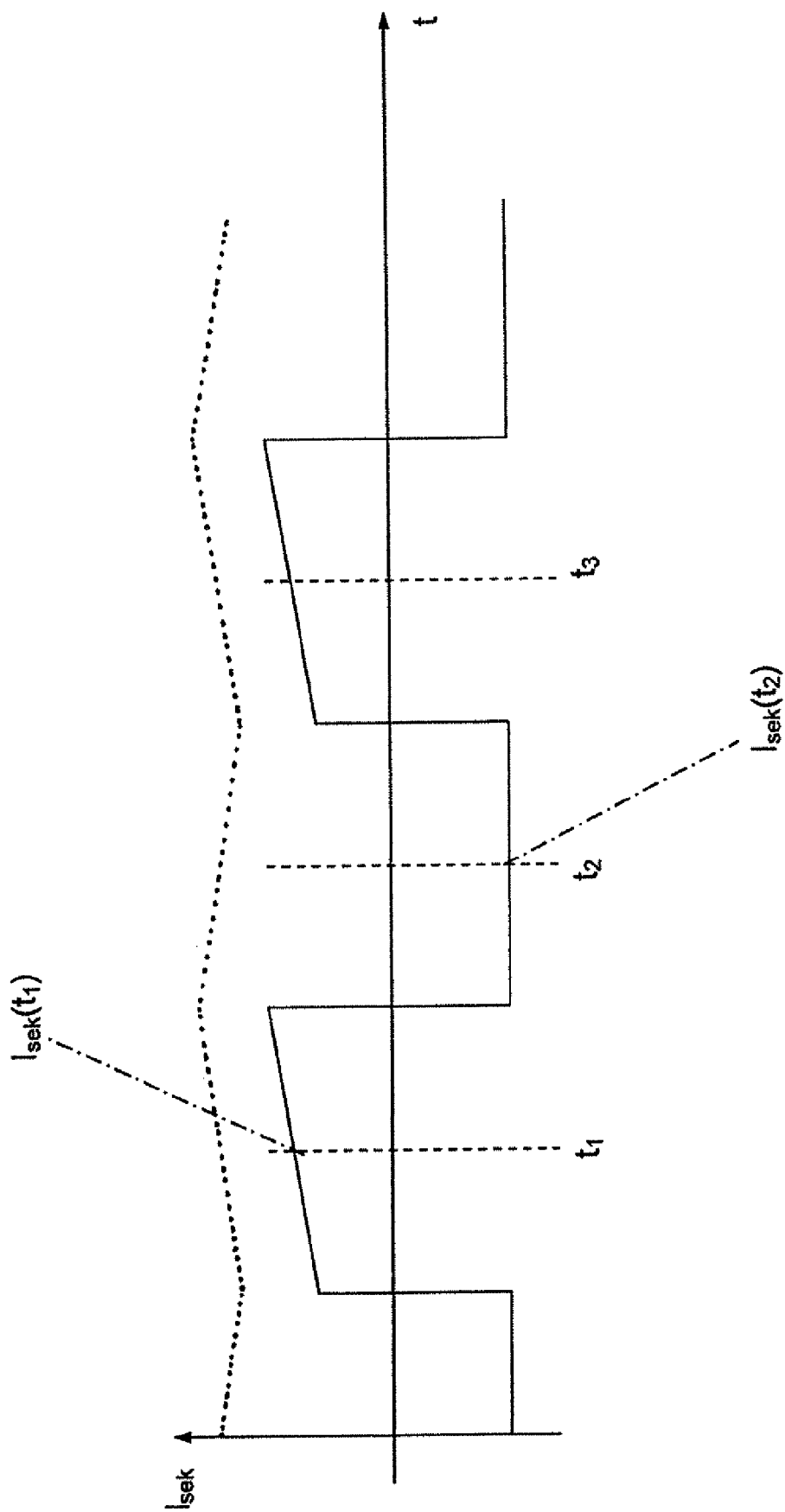

As can be seen in FIG. 4, the sampling of the secondary current occurs in each case at the center of the pulse phases (for example at times $t_1$, $t_3$) and at the center of the pulse pauses (for example at time $t_2$) of the control signal.

Figure 6:
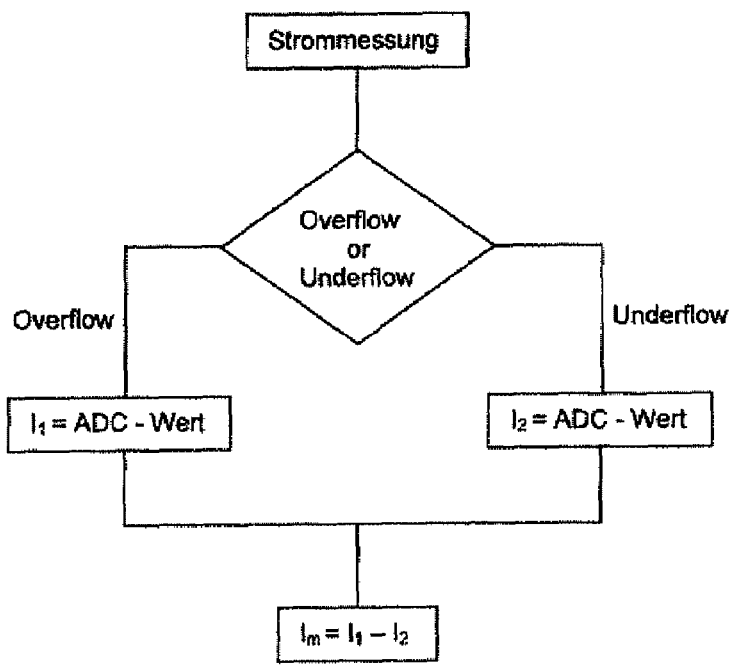
Figure 5:
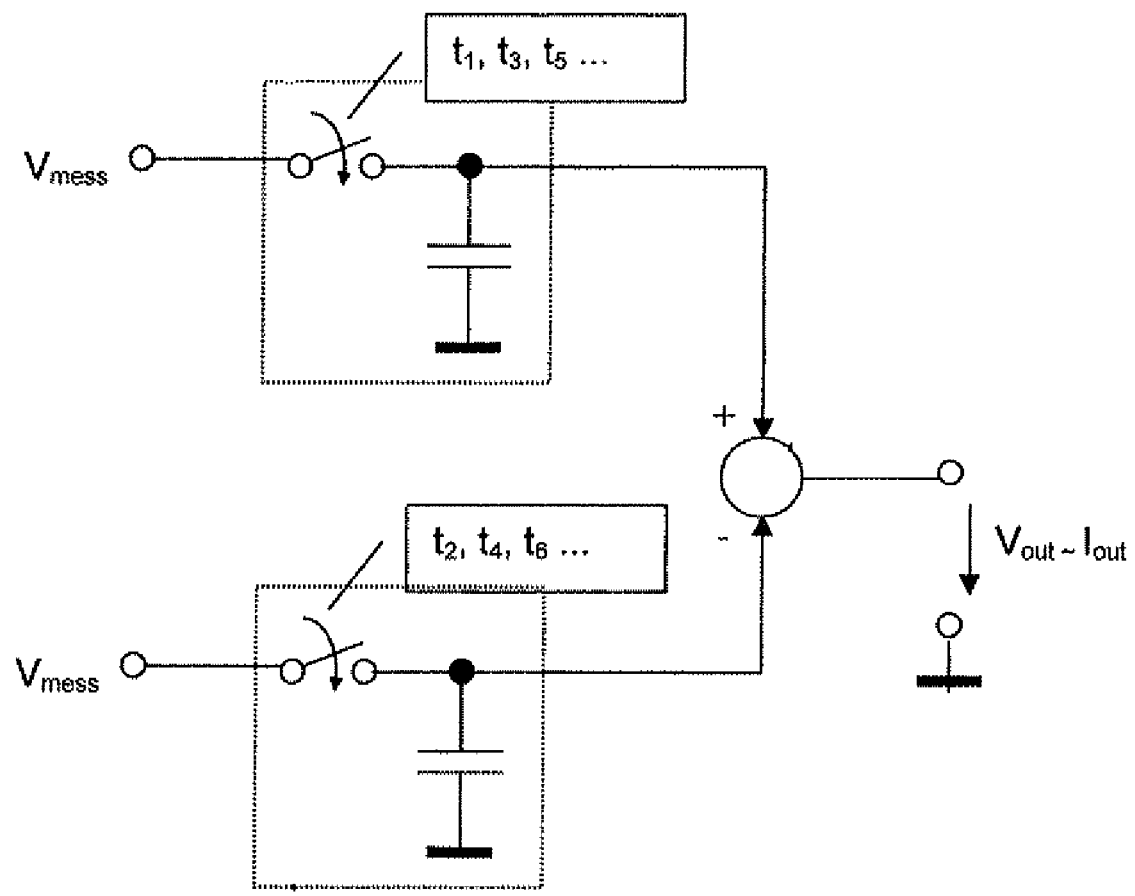

The measured-value signal conditioning device has means to generate two measured-value signals $I_{sek}(t_1)$, $I_{sek}(t_2)$ shown in FIG. 4. Of these signals, a first measured-value signal $I_{sek}(t_1)$ corresponds to the output current of the alternating-current converter 6 when the first semiconductor switch 5a is closed, and a second measured-value signal corresponds to the output current of the alternating-current converter 6 when the first semiconductor switch 5a is open. As shown schematically in FIG. 5, the measured-value signals $I_{sek}(t_1)$, $I_{sek}(t_2)$ are provided and temporarily stored in a microcomputer in the form of digital signals. The difference between the measured-value signals $Isek(t_1)$, $I_{sek}(t_2)$ is determined with the aid of a microprocessor (FIGS. 5 and 6). This corresponds to the output current flowing through the output connection.

Figure 7:
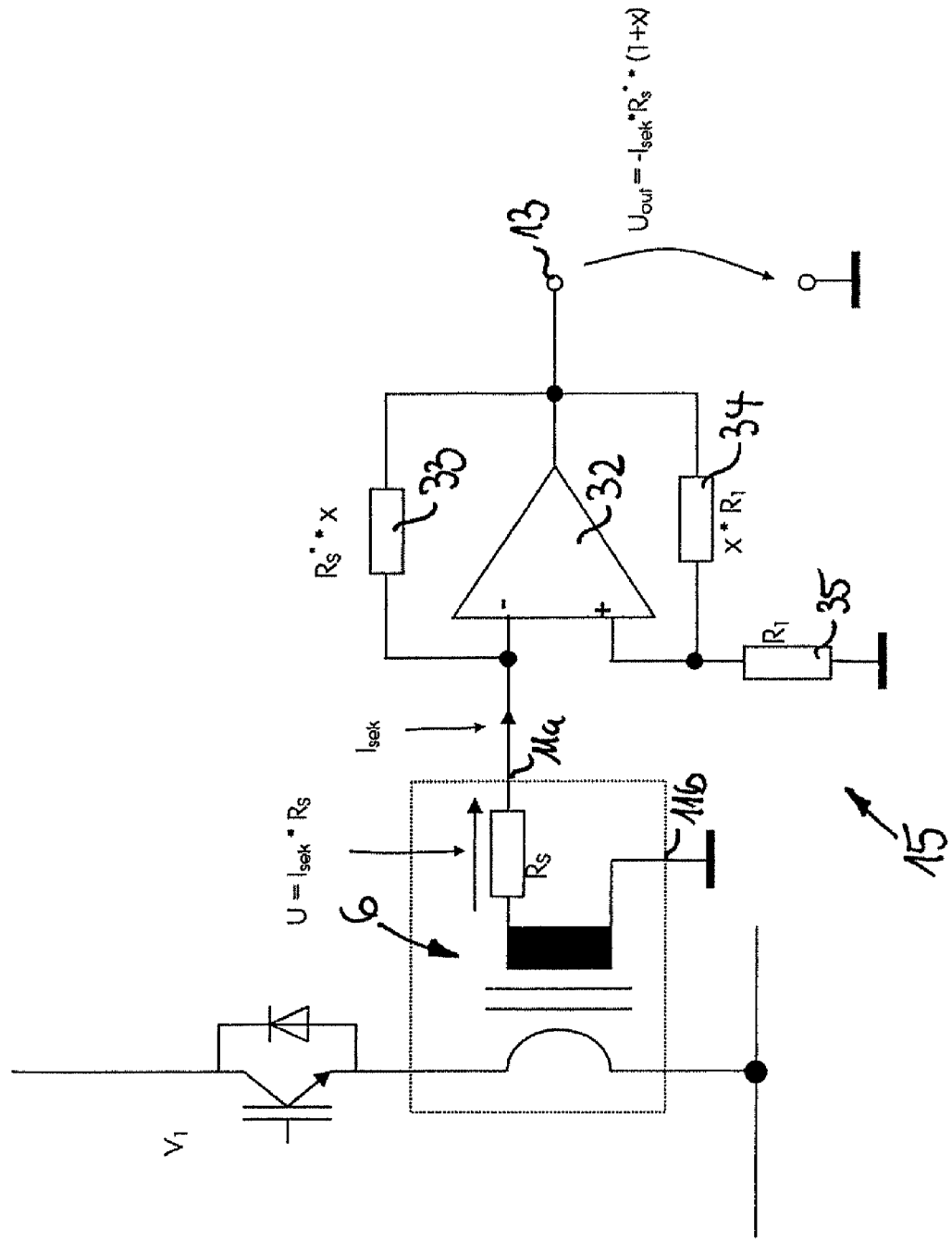

In the example of the embodiment shown in FIG. 7 the output of the alternating-current converter 6 is connected to the input of an INIC 15 that loads the output of the alternating-current converter 6 with a negative ohmic resistance which, ideally, is just as large in a negative direction as the ohmic secondary resistance $R_s$ of the alternating-current converter 6. However, to ensure that the circuit remains stable, the negative resistance cannot be made just as large. In actual practice, the negative resistance is chosen to be somewhat smaller than the secondary resistance $R_s$. The INIC 15 largely compensates for the unfavorable effect of the secondary resistance $R_s$. Since the negative ohmic input resistance of the INIC 15 is somewhat smaller than the ohmic secondary resistance Rs of the alternating-current converter 6, the circuit operates in a stable manner.

The INIC 15 has an operational amplifier 32 whose inverting input is connected to an output connection 11a of the alternating-current converter 6. The other output connection 11b of the alternating-current converter 6 is connected to ground potential. The inverting input of the operational amplifier 32 is connected across a first resistance 33 to the output 13 of the operational amplifier 32. The value of the first resistance 33 corresponds to the value of a resistance Rs', which is somewhat larger or somewhat smaller than the secondary resistance $R_s$ of the alternating-current converter 6, multiplied by a factor of x.

The factor x may have any given positive value, and in some cases may also be equal to 1.

The noninverting input is connected across a second resistance 34 to the output of the operational amplifier 32 and across the third resistance 35 to the ground potential. The value of the second resistance 34 corresponds to the value of the third resistance 35 multiplied by a factor x.

Figure 9:
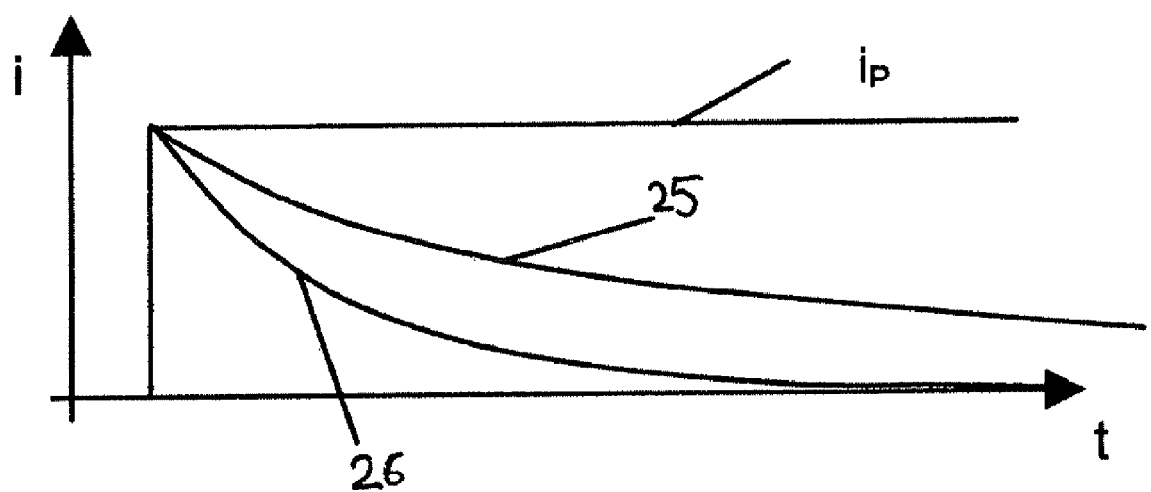

The electrical voltage at the primary inductance $L_H$ of the alternating-current converter 6 is controlled to a value approaching zero by the INIC 15. Thus, the alternating-current converter 6 transfers the current proportionally, even at low frequencies. FIG. 9 shows that the step response 25 of an alternating-current converter 6 compensated with the INIC 15 has a flatter curve than the step response 26 of a corresponding uncompensated alternating-current converter 6.

Figure 8:
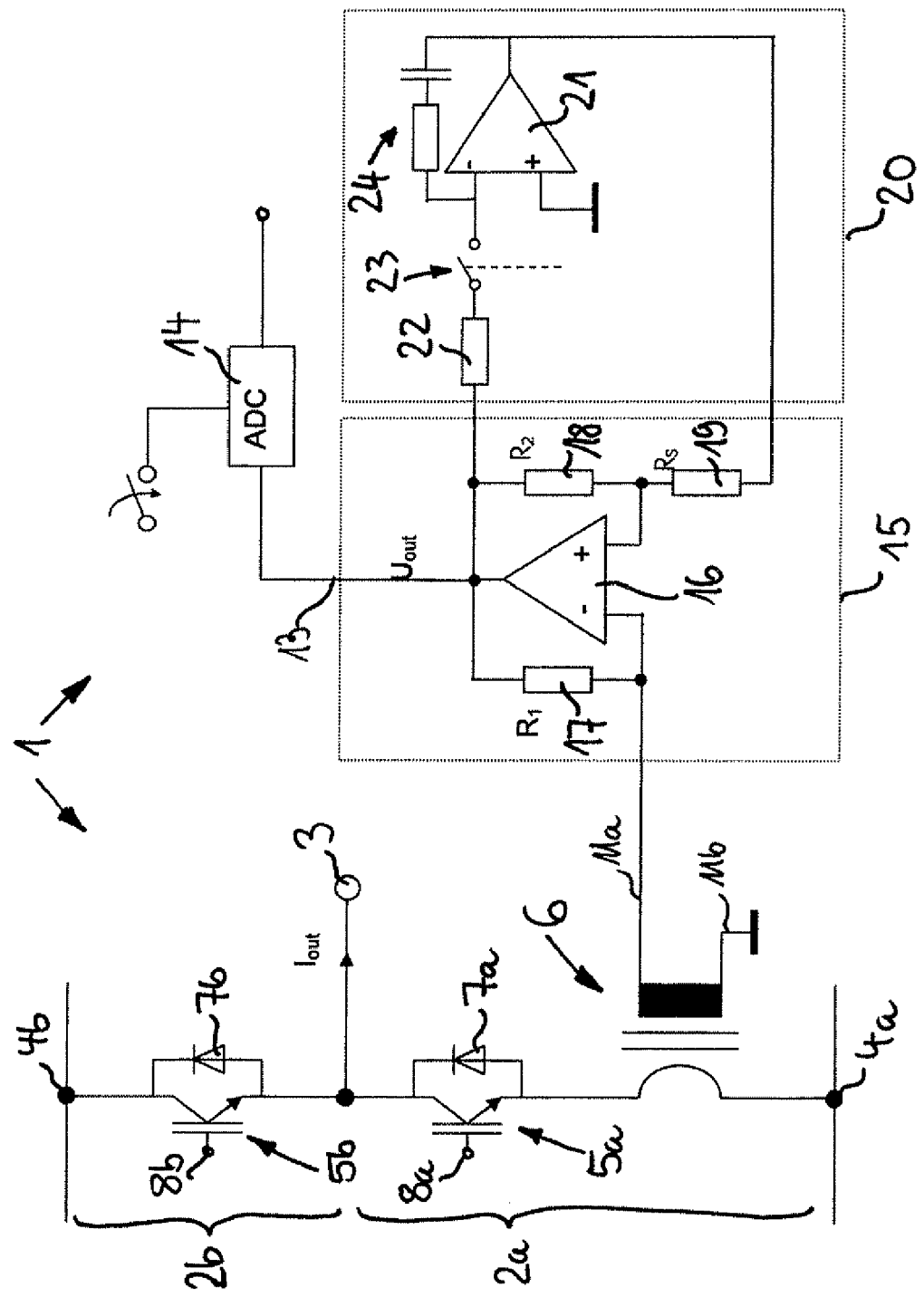

In a further example of an embodiment shown in FIG. 8 the output of the alternating-current converter 6 is also connected to the input of an INIC 15. The INIC 15 [has] a second operational amplifier 16 whose inverting input is connected to an output connection 11a of the alternating-current converter 6. The other output connection 11b of the alternating-current converter 6 is connected to ground potential. The inverting input of the second operational amplifier 16 is connected across a fourth resistance 17 to the output of the second operational amplifier 16. This amplifier is connected to the input of the analog-digital converter 14. The noninverting input of the second operational amplifier 16 is connected across a fifth resistance 18 to the output of the second operational amplifier 16. In addition, the noninverting input of the second operational amplifier 16 is connected across a sixth resistance 19 to the output of an additional sample-and-hold element 20.

The additional sample-and-hold element 20 has a third operational amplifier 21 that is connected across a seventh resistance 22 and an electronic switch 23 to the inverting input of the third operational amplifier 21. The inverting input is also connected across an RC element 24 to the output of the third operational amplifier 21. The noninverting input of the second operational amplifier 21 is connected to ground potential. A trigger input (which is not shown in detail in the drawing) of the electronic switch 23 is connected to the control device by means of a control connection in such a way that the switch 23 is conductive when the first semiconductor switch 5a is open.

Figure 10:
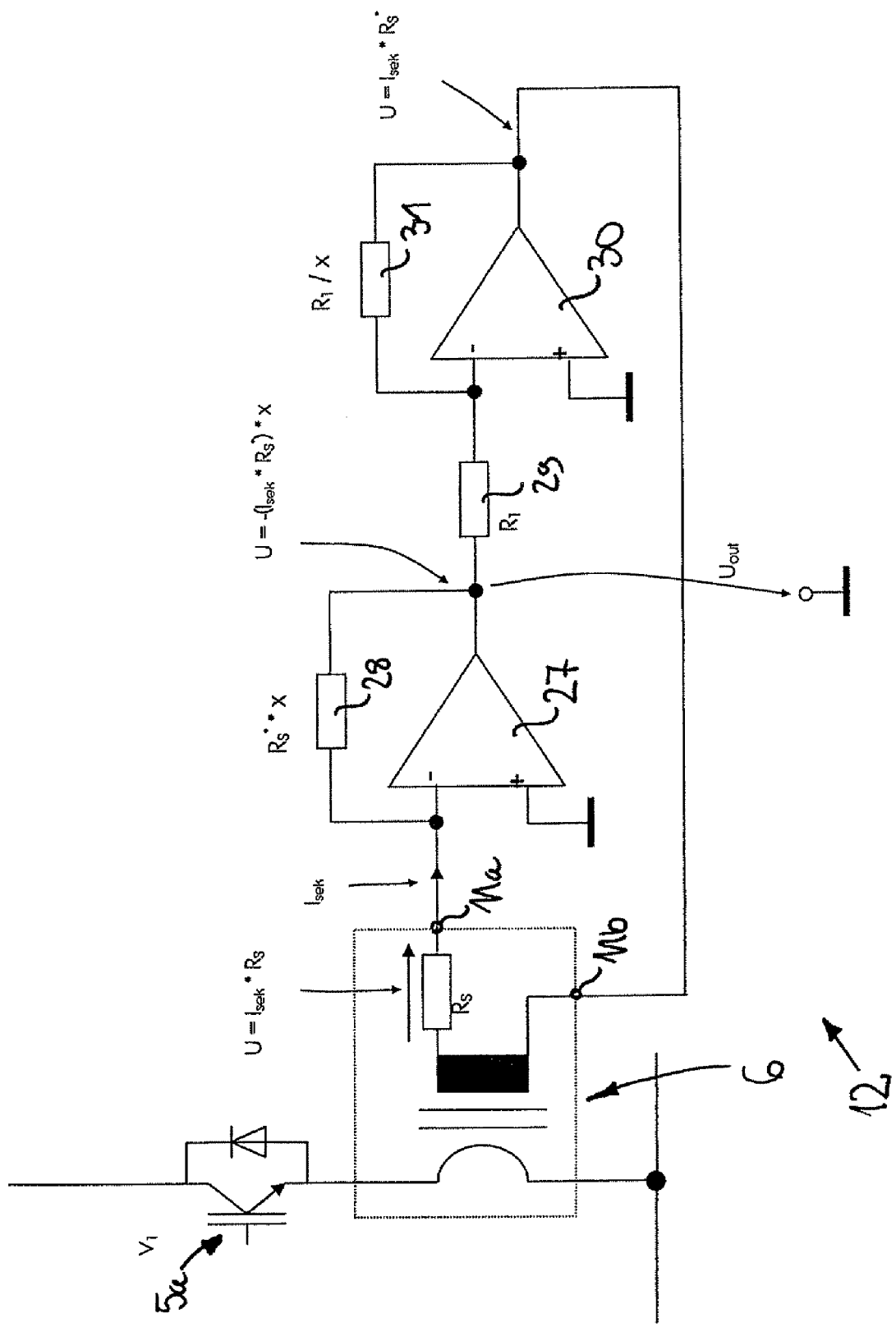

In a different example of an embodiment shown in FIG. 10 the alternating-current converter 6 is connected in series on the input side to only one clocked semiconductor switch 5a. A control input of the semiconductor switch 5a is connected to a pulse width modulation output of a control device, which is not shown in greater detail in the drawing.

The output connections 11a, 11b of the alternating-current converter 6 are connected across an active compensation circuit 12 to a measurement output for a current measurement signal. With the aid of the compensation circuit 12 a voltage is applied to the converter output connections 11a, 11b. This voltage is directed in opposition to the voltage that, when current is flowing in the secondary resistance $R_s$, is decreasing in said secondary resistance. The voltage that is applied to converter output connections 11a, 11b is controlled as a function of the current flowing through converter output connections 11a, 11b in such a way that no electrical voltage or only a small electrical voltage is present at the primary inductance $L_H$.

The compensation circuit 12 has a first amplifier 27 that is connected at its inverting input to a first converter output connection 1 la and that is connected at its noninverting input to a reference potential. The inverting input of the first amplifier 27 is connected across a first resistance element 28 to the output of the first amplifier 27. The value of the first resistance element 28 corresponds to the value of the resistance $R_s'$, which is somewhat larger or somewhat smaller than the secondary resistance $R_S$, multiplied by a factor of x. The factor x may have any given positive value and may in some cases also be equal to 1.

The output of the first amplifier 27 is connected across a second resistance element 29 to an inverting input of a second amplifier 30, whose noninverting input is connected to the reference potential. The inverting input of the second amplifier 30 is connected across a third resistance element 31 to the output of the second amplifier 30 and to a second output 11b of the alternating-current amplifier 6.

The value of the third resistance element 31 corresponds to the value of the secondary resistance $R_s$ divided by the factor x.

The voltage $U_{out}$ applied to the output of the first amplifier 27 is proportional to the secondary current $I_{sek}$ of the alternating-current converter 6 and, thus, also to its primary current. The voltage at the output of the second amplifier 30 has a value of $I_{sek}*R_s'$ and therefore approximately corresponds to the inverted voltage $I_{sek}*R_s$ that is dropping at the secondary resistance $R_s$. The amplifiers 27, 30 preferably are operational amplifiers.

Figure 11:
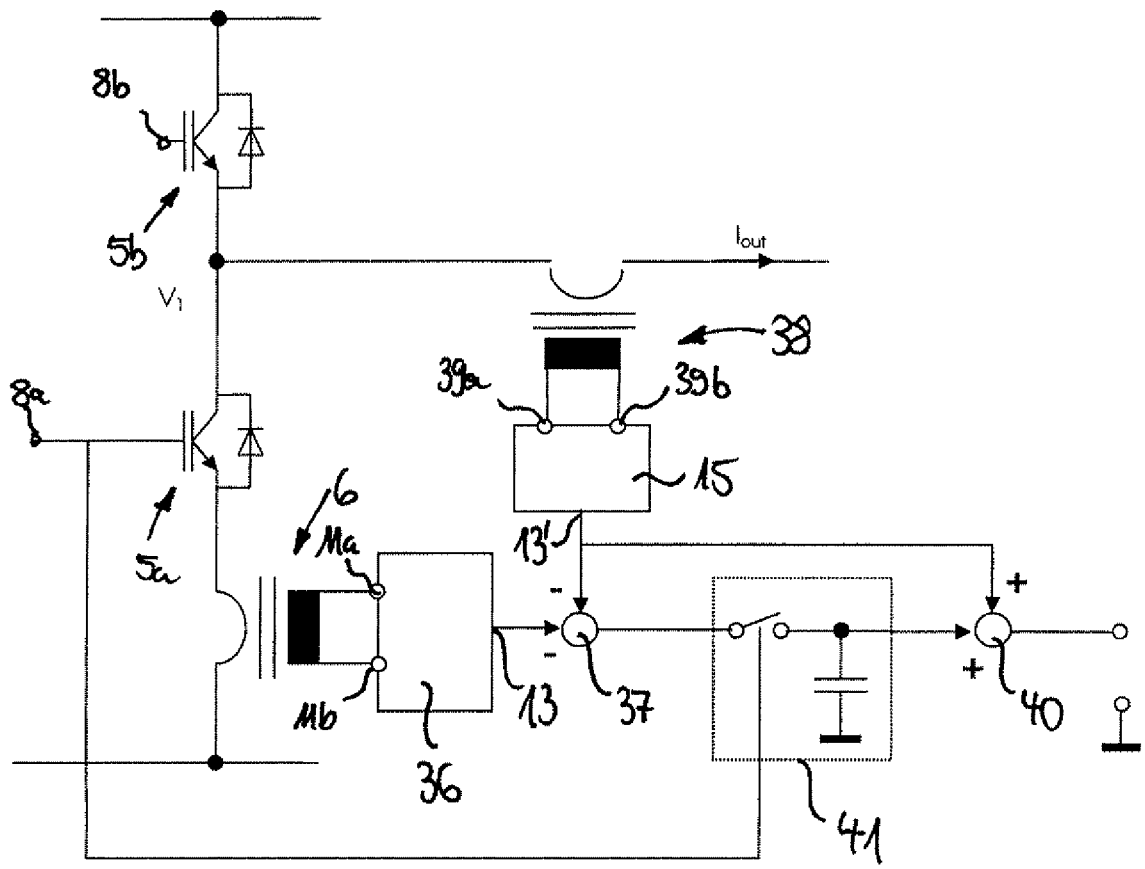

The measuring device shown in FIG. 11 is used to measure the output current of a clocked half-bridge circuit. This circuit has a half-bridge with two series-connected half-bridge sections 2a, 2b. A series circuit comprising the first semiconductor switch 5a and the primary winding of a first alternating-current converter 6 is located in the first half-bridge section 2a. The second semiconductor switch 5b is provided in the second half-bridge section 2b. Circuit block 36, which is connected to the output connections 11a, 11b of the first alternating-current converter 6, corresponds to the arrangement consisting of the INIC 15 and the second amplifier 20 in FIG. 8. The output 13 of the INIC 15 is attached to a first inverting input of a first addition element 37.

The half-bridge sections 2a, 2b are connected at a connection node to an output connection 3 that is connected across an input of a second alternating-current converter 38 to an appliance, which is not shown in greater detail in the drawing. The INIC 15 shown in FIG. 7 is connected to the output connections 39a, 39b of the second alternating-current converter 38. The output 13' of the INIC 15 is connected to a second inverting input of the first addition element 37 and to a first input of a second addition element 40. The output of the first addition element 37 is connected across a buffer 41 to a second input of the second addition element 40. A sampling input of the buffer 41 is connected to a control input of the first semiconductor switch 5a.

The output of the second addition element 40 forms the measurement output for the current measurement signal. This is available continuously.

The invention claimed is:

1. A measuring device for measuring an electrical current having an alternating-current converter that possesses a primary inductance ($L_H$) and an ohmic secondary resistance ($R_S$) and whose output is connected across a measured-value signal conditioning device to a measurement output for a current measurement signal, wherein an active compensation circuit, at least partially compensates for the voltage drop caused by a current flow in the secondary resistance ($R_S$) at the primary inductance ($L_H$) by applying a voltage at the output of the alternating-current converter, is disposed between the output of the alternating-current converter and the measurement output.

2. The measuring device of claim 1, wherein the compensation circuit is an INIC whose internal resistance preferably is quantitatively somewhat smaller or larger than the secondary resistance ($R_S$).

3. The measuring device of claim 1, wherein said measuring device has at least one clocked semiconductor switch that is connected by means of a control connection to a control device, and the input of the alternating-current converter is connected in series to the semiconductor switch.

4. The measuring device of claim 3, wherein the measured-value signal conditioning device has means for generating at least two measured-value signals, of which a first measured-value signal corresponds to the output current of the alternating-current converter when the semiconductor switch is closed and a second measured-value signal corresponds to the output current of the alternating-current converter when the semiconductor switch is open, and the connections carrying measured-value signals are connected to the measurement output across a subtraction element.

5. The measuring device of claim 4, wherein the sample-and-hold element is connected by means of a control connection to the control device for the semiconductor switch in such a way that the sampling for the first measured-value signal occurs centered in a time interval while the semiconductor switch is closed, and/or the sampling for the second measured-value signal occurs centered in a time interval while the semiconductor switch is open.

6. The measuring device of claim 4, wherein the output of the alternating-current converter is connected to a first input of a subtraction element, and the output of the subtraction element is connected to the measurement output and to an input of an additional sample-and-hold element, whose output is connected to a second input of the subtraction element, and a sampling input of the additional sample-and-hold element is connected to the control device by means of a control connection in such a way that the measurement output is regulated to a specified electrical potential when the first semiconductor switch is closed or open.

7. The measuring device of claim 3, includes a second alternating-current converter, wherein the output of the first alternating-current converter and the output of the second alternating-current converter are connected to the inputs of a first addition element and its output to a buffer, the buffer has a control connection to the control device for closing the connection between the output of the first addition element and the buffer when the semiconductor switch is closed, following the buffer, a second addition element is connected to the buffer, and its one input is connected to the buffer and its other input is connected to the output of the second alternating-current converter, and the output of the second addition element forms the output current measuring output.

8. The measuring device of claim 3, wherein said measuring device has a second semiconductor switch that is connected in series to the first semiconductor switch and whose connection node is connected to an output connection, and the semiconductor switches can be controlled in push-pull operation by means of the control device in order to form a clocked half-bridge circuit.

9. The measuring device of claim 7, wherein the second alternating-current converter has a second primary inductance and a second ohmic secondary resistance; and a second active compensation circuit, which at least partially compensates for the voltage drop caused at the second primary inductance by a current flow in the second secondary resistance by applying a voltage at the output of the second alternating-current converter, is located between the output of the second alternating-current converter and the inputs of the first addition element.

10. The measuring device of claim 8, wherein the output connection is connected to the winding of an electric motor, in particular a stepper motor.

* * * * *